(12) United States Patent
Jin

(10) Patent No.: US 9,503,080 B2
(45) Date of Patent: Nov. 22, 2016

(54) SWITCH CELL

(71) Applicant: Taiwan Semiconductor Manufacturing Company Limited, Hsin-Chu (TW)

(72) Inventor: Jun-De Jin, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/453,740

(22) Filed: Aug. 7, 2014

(65) Prior Publication Data

US 2016/0043069 A1    Feb. 11, 2016

(51) Int. Cl.
*H01L 29/94* (2006.01)
*H03K 17/693* (2006.01)
*H01L 27/118* (2006.01)

(52) U.S. Cl.
CPC ....... *H03K 17/693* (2013.01); *H01L 27/11807* (2013.01)

(58) Field of Classification Search
CPC ................................................. H01L 27/11807
USPC ........................... 251/351; 327/516; 257/351
See application file for complete search history.

(56) References Cited

U.S. PATENT DOCUMENTS

| 2004/0032759 A1* | 2/2004 | Chow ..................... G11C 11/22 365/145 |
| 2012/0105137 A1* | 5/2012 | Kok et al. ...................... 327/536 |
| 2013/0024828 A1* | 1/2013 | Lu ....................... G06F 17/5068 716/103 |
| 2015/0008894 A1* | 1/2015 | Cannankurichi et al. .... 323/282 |

OTHER PUBLICATIONS

"Identification of RF harmonic distortion on Si substrates and its reduction using a trap-rich layer" Daniel C. Kerr, et al, 2008, pp. 151-153.
"A 1.8-GHz 33-dBm 0.1-dB CMOS T/R Switch Using Stacked FETs With Feed-Forward Capacitors in a Floated Well Structure" Minsik Ahn, et al., IEEE Transactions on Microwave Theory and Techniques, vol. 57, No. 11, Nov. 2009, pp. 2661-2670.

* cited by examiner

*Primary Examiner* — Marc Armand
*Assistant Examiner* — Tifney Skyles
(74) *Attorney, Agent, or Firm* — Cooper Legal Group, LLC

(57) ABSTRACT

A radio-frequency (RF) switch circuit is configured to maintain a disconnection or a connection between a node and an antenna terminal. The RF switch circuit comprises one or more switch cells. A switch cell comprises one or more transistors. The switch cell comprises one or more gate-drain capacitors. The switch cell comprises one or more source-drain capacitors. A gate-drain capacitor is coupled between a gate of a transistor and a drain of the transistor. A source-drain capacitor is coupled between a source of a transistor and a drain of the transistor.

20 Claims, 3 Drawing Sheets

SWITCH CELL

BACKGROUND

A switch cell is a circuit that can be used to maintain a connection or maintain a disconnection between two nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
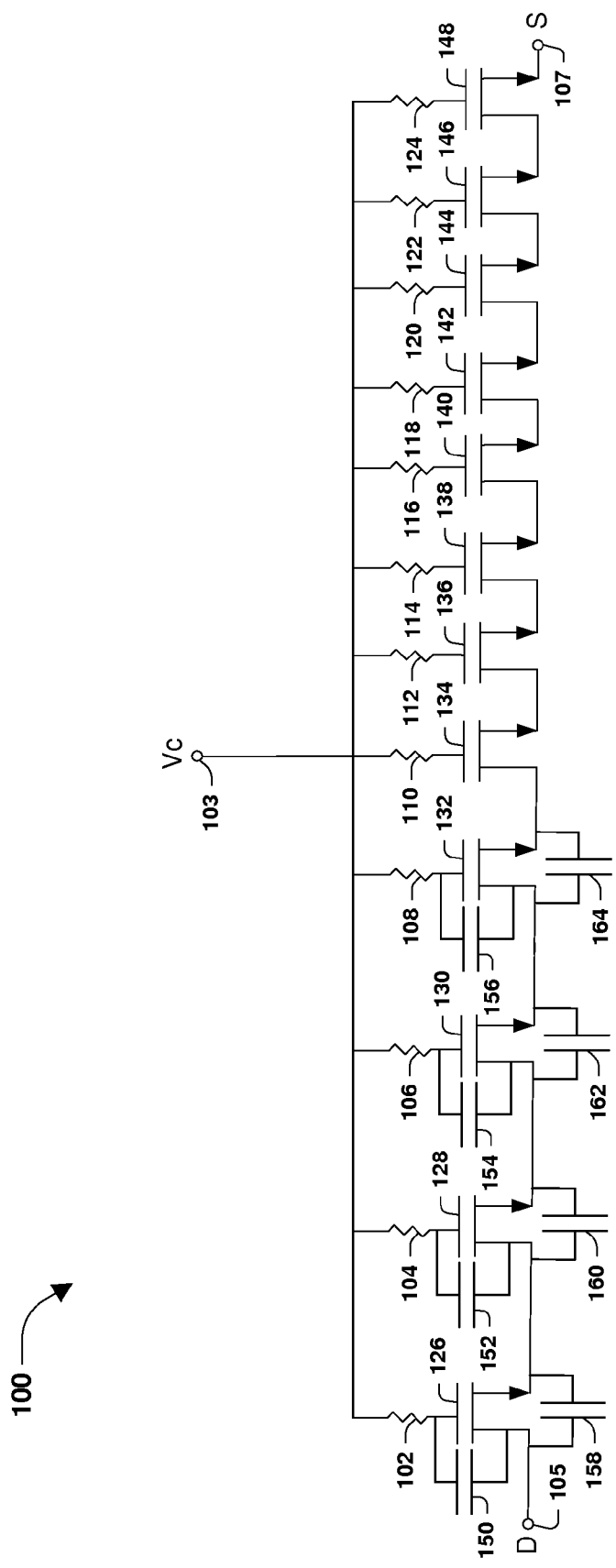
FIG. 1 is an illustration of a circuit schematic of a switch cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A circuit schematic of a switch cell 100 is illustrated in FIG. 1, according to some embodiments. In some embodiments, the switch cell 100 comprises a plurality of transistors. In some embodiments, the plurality of transistors comprises NMOS transistors. In some embodiments, the plurality of transistors comprises PMOS transistors. In some embodiments, the plurality of transistors comprises NMOS transistors and PMOS transistors. In some embodiments, the plurality of transistors comprises 12 transistors. In some embodiments, the plurality of transistors comprises fewer than 12 transistors. In some embodiments, the plurality of transistors comprises more than 12 transistors. In some embodiments, the plurality of transistors comprises at least one of a first transistor 126, a second transistor 128, a third transistor 130, a fourth transistor 132, a fifth transistor 134, a sixth transistor 136, a seventh transistor 138, an eighth transistor 140, a ninth transistor 142, a tenth transistor 144, an eleventh transistor 146 or a twelfth transistor 148.

In some embodiments, the switch cell 100 comprises a plurality of resistors. In some embodiments, the plurality of resistors comprises a number of resistors equal to a number of transistors of the plurality of transistors. In some embodiments, the plurality of resistors comprises at least one of a first resistor 102, a second resistor 104, a third resistor 106, a fourth resistor 108, a fifth resistor 110, a sixth resistor 112, a seventh resistor 114, an eighth resistor 116, a ninth resistor 118, a tenth resistor 120, an eleventh resistor 122 or a twelfth resistor 124.

In some embodiments, the switch cell 100 comprises a plurality of gate-drain capacitors. In some embodiments, a gate-drain capacitor of the plurality of gate-drain capacitors has a capacitance substantially equal to 400 fF capacitors. In some embodiments, a gate-drain capacitor of the plurality of gate-drain capacitors has a capacitance between about 300 fF to about 500 fF. In some embodiments, a gate-drain capacitor of the plurality of gate-drain capacitors has a capacitance less than about 300 fF. In some embodiments, a gate-drain capacitor of the plurality of gate-drain capacitors has a capacitance greater than about 500 fF. In some embodiments, the plurality of gate-drain capacitors comprises four gate-drain capacitors. In some embodiments, the plurality of gate-drain capacitors comprises fewer than four gate-drain capacitors. In some embodiments, the plurality of gate-drain capacitors comprises more than four gate-drain capacitors. In some embodiments, the plurality of gate-drain capacitors comprises at least one of a first gate-drain capacitor 150, a second gate-drain capacitor 152, a third gate-drain capacitor 154 or a fourth gate-drain capacitor 156.

In some embodiments, the switch cell 100 comprises a plurality of source-drain capacitors. In some embodiments, a source-drain capacitor of the plurality of source-drain capacitors has a capacitance substantially equal to 150 fF capacitors. In some embodiments, a source-drain capacitor of the plurality of source-drain capacitors has a capacitance between about 100 fF to about 200 fF. In some embodiments, a source-drain capacitor of the plurality of source-drain capacitors has a capacitance less than about 100 fF. In some embodiments, a source-drain capacitor of the plurality of source-drain capacitors has a capacitance greater than about 200 fF. In some embodiments, the plurality of source-drain capacitors comprises a number of source-drain capacitors equal to a number of gate-drain capacitors of the plurality of gate-drain capacitors. In some embodiments, the plurality of source-drain capacitors comprises a number of source-drain capacitors less than the number of gate-drain capacitors of the plurality of gate-drain capacitors. In some embodiments, the plurality of source-drain capacitors comprises a number of source-drain capacitors greater than the number of gate-drain capacitors of the plurality of gate-drain capacitors. In some embodiments, the plurality of source-drain capacitors comprises four source-drain capacitors. In some embodiments, the plurality of source-drain capacitors comprises fewer than four source-drain capacitors. In some embodiments, the plurality of source-drain capacitors comprises more than four source-drain capacitors. In some embodiments, the plurality of source-drain capacitors comprises at least one of a first source-drain capacitor 158, a second source-drain capacitor 160, a third source-drain capacitor 162 or a fourth source-drain capacitor 164.

In some embodiments, the switch cell 100 comprises a plurality of source-gate capacitors. In some embodiments, a source-gate capacitor is a capacitor that is connected between a source of a transistor of the plurality of transistors and a gate of the transistor. In some embodiments, the plurality of source-gate capacitors comprises a number of source-gate capacitors equal to a number of source-drain capacitors of the plurality of source-drain capacitors. In some embodiments, the plurality of source-gate capacitors comprises a number of source-gate capacitors less than the number of source-drain capacitors of the plurality of source-drain capacitors. In some embodiments, the plurality of source-gate capacitors comprises a number of source-gate capacitors greater than the number of source-drain capacitors of the plurality of source-drain capacitors. In some embodiments, the plurality of source-gate capacitors comprises four source-gate capacitors. In some embodiments, the plurality of source-gate capacitors comprises fewer than four source-gate capacitors. In some embodiments, the plurality of source-gate capacitors comprises more than four source-gate capacitors.

In some embodiments, the switch cell 100 comprises a gate terminal (Vc) 103 connected to at least one of a first side of the first resistor 102, a first side of the second resistor 104, a first side of the third resistor 106, a first side of the fourth resistor 108, a first side of the fifth resistor 110, a first side of the sixth resistor 112, a first side of the seventh resistor 114, a first side of the eighth resistor 116, a first side of the ninth resistor 118, a first side of the tenth resistor 120, a first side of the eleventh resistor 122 or a first side of the twelfth resistor 124. In some embodiments, a second side of the first resistor 102 is connected to a gate of the first transistor 126. In some embodiments, a second side of the second resistor 104 is connected to a gate of the second transistor 128. In some embodiments, a second side of the third resistor 106 is connected to a gate of the third transistor 130. In some embodiments, a second side of the fourth resistor 108 is connected to a gate of the fourth transistor 132. In some embodiments, a second side of the fifth resistor 110 is connected to a gate of the fifth transistor 134. In some embodiments, a second side of the sixth resistor 112 is connected to a gate of the sixth transistor 136. In some embodiments, a second side of the seventh resistor 114 is connected to a gate of the seventh transistor 138. In some embodiments, a second side of the eighth resistor 116 is connected to a gate of the eighth transistor 140. In some embodiments, a second side of the ninth resistor 118 is connected to a gate of the ninth transistor 142. In some embodiments, a second side of the tenth resistor 120 is connected to a gate of the tenth transistor 144. In some embodiments, a second side of the eleventh resistor 122 is connected to a gate of the eleventh transistor 146. In some embodiments, a second side of the twelfth resistor 124 is connected to a gate of the twelfth transistor 148.

In some embodiments, a drain of the first transistor 126 is connected to a drain terminal (D) 105 of the switch cell 100. In some embodiments, a source of the first transistor 126 is connected to a drain of the second transistor 128. In some embodiments, a source of the second transistor 128 is connected to a drain of the third transistor 130. In some embodiments, a source of the third transistor 130 is connected to a drain of the fourth transistor 132. In some embodiments, a source of the fourth transistor 132 is connected to a drain of the fifth transistor 134. In some embodiments, a source of the fifth transistor 134 is connected to a drain of the sixth transistor 136. In some embodiments, a source of the sixth transistor 136 is connected to a drain of the seventh transistor 138. In some embodiments, a source of the seventh transistor 138 is connected to a drain of the eighth transistor 140. In some embodiments, a source of the eighth transistor 140 is connected to a drain of the ninth transistor 142. In some embodiments, a source of the ninth transistor 142 is connected to a drain of the tenth transistor 144. In some embodiments, a source of the tenth transistor 144 is connected to a drain of the eleventh transistor 146. In some embodiments, a source of the eleventh transistor 146 is connected to a drain of the twelfth transistor 148. In some embodiments, a source of the twelfth transistor 148 is connected to a source terminal (S) 107 of the switch cell 100.

In some embodiments, the first gate-drain capacitor 150 is a capacitor that is connected between the gate of the first transistor 126 and the drain of the first transistor 126, such that a first side of the first gate-drain capacitor 150 is connected to the gate of the first transistor 126 and a second side of the first gate-drain capacitor 150 is connected to the drain of the first transistor 126. In some embodiments, the second gate-drain capacitor 152 is a capacitor that is connected between the gate of the second transistor 128 and the drain of the second transistor 128, such that a first side of the second gate-drain capacitor 152 is connected to the gate of the second transistor 128 and a second side of the second gate-drain capacitor 152 is connected to the drain of the second transistor 128. In some embodiments, the third gate-drain capacitor 154 is a capacitor that is connected between the gate of the third transistor 130 and the drain of the third transistor 130, such that a first side of the third gate-drain capacitor 154 is connected to the gate of the third transistor 130 and a second side of the third gate-drain capacitor 154 is connected to the drain of the third transistor 130. In some embodiments, the fourth gate-drain capacitor 156 is a capacitor that is connected between the gate of the fourth transistor 132 and the drain of the fourth transistor 132, such that a first side of the fourth gate-drain capacitor 156 is connected to the gate of the fourth transistor 132 and a second side of the fourth gate-drain capacitor 156 is connected to the drain of the fourth transistor 132.

In some embodiments, the first source-drain capacitor 158 is a capacitor that is connected between the source of the first transistor 126 and the drain of the first transistor 126, such that a first side of the first source-drain capacitor 158 is connected to the source of the first transistor 126 and a second side of the first source-drain capacitor 158 is connected to the drain of the first transistor 126. In some embodiments, the second source-drain capacitor 160 is a capacitor that is connected between the source of the second transistor 128 and the drain of the second transistor 128, such that a first side of the second source-drain capacitor 160 is connected to the source of the second transistor 128 and a second side of the second source-drain capacitor 160 is connected to the drain of the second transistor 128. In some embodiments, the third source-drain capacitor 162 is a capacitor that is connected between the source of the third transistor 130 and the drain of the third transistor 130, such that a first side of the third source-drain capacitor 162 is connected to the source of the third transistor 130 and a second side of the third source-drain capacitor 162 is connected to the drain of the third transistor 130. In some embodiments, the fourth source-drain capacitor 164 is a capacitor that is connected between the source of the fourth transistor 132 and the drain of the fourth transistor 132, such that a first side of the fourth source-drain capacitor 164 is connected to the source of the fourth transistor 132 and a second side of the fourth source-drain capacitor 164 is connected to the drain of the fourth transistor 132.

Figure 2:
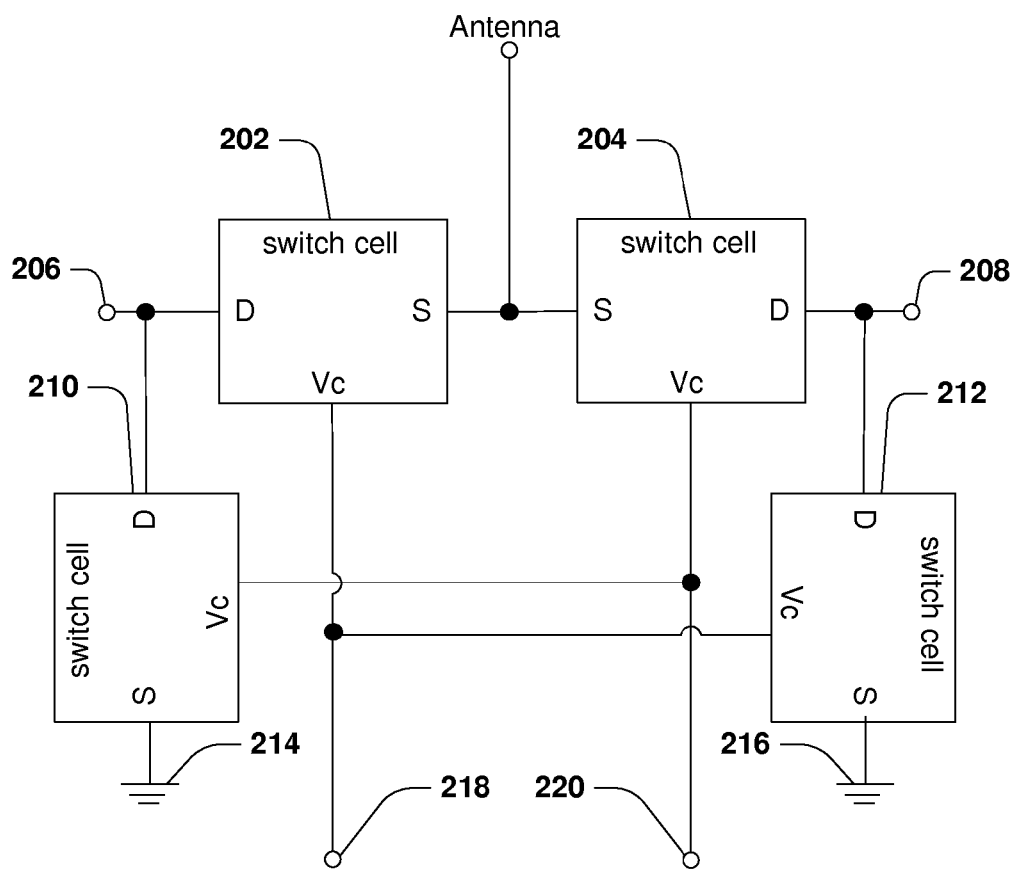
FIG. 2 is an illustration of a circuit schematic of at least a portion of a radio-frequency (RF) switch circuit, in accordance with some embodiments.

A circuit schematic of at least a portion of a radio-frequency (RF) switch circuit is illustrated in FIG. 2, according to some embodiments. In some embodiments, the RF switch circuit comprises four switch cells. In some embodiments, the RF switch circuit comprises fewer than four switch cells. In some embodiments, the RF switch circuit comprises more than four switch cells. In some embodiments, the RF switch circuit comprises at least one of a first switch cell 202, a second switch cell 204, a third switch cell 210 or a fourth switch cell 212. In some embodiments, a drain terminal (D) of the first switch cell 202 is connected to a first node 206 and to a drain terminal (D) of the third switch cell 210. In some embodiments, a source terminal (S) of the first switch cell 202 is connected to an antenna terminal and to a source terminal (S) of the second switch cell 204. In some embodiments, the antenna terminal is connected to an antenna that is configured to at least one of transmit or receive one or more signals. In some embodiments, a drain terminal (D) of the second switch cell 204 is connected to a second node 208 and to a drain terminal (D) of the fourth switch cell 212. In some embodiments, a source terminal (S) of the third switch cell 210 is connected to a first voltage source 214. In some embodiments, a source terminal (S) of the fourth switch cell 212 is connected to a second voltage source 216. In some embodiments, the first voltage source 214 is the same as the second voltage source 216. In some embodiments, the first voltage source 214 is not the same as the second voltage source 216. In some embodiments, the first voltage source 214 is ground. In some embodiments, the second voltage source 216 is ground. In some embodiments, the first voltage source 214 is not ground. In some embodiments, the second voltage source 216 is not ground. In some embodiments, a third node 218 is connected to at least one of a gate terminal (Vc) of the first switch cell 202 or to a gate terminal (Vc) of the fourth switch cell 212. In some embodiments, a fourth node 220 is connected to at least one of a gate terminal (Vc) of the second switch cell 204 or to a gate terminal (Vc) of the third switch cell 210.

In some embodiments, a first control signal exists at the third node 218. In some embodiments, a second control signal exists at the fourth node 220. In some embodiments, the first control signal has a high state voltage. In some embodiments, the first control signal has a low state voltage. In some embodiments, the first control signal switches between the high state voltage and the low state voltage. In some embodiments, the second control signal has the high state voltage. In some embodiments, the second control signal has the low state voltage. In some embodiments, the second control signal switches between the high state voltage and the low state voltage. In some embodiments, the first control signal has the high state voltage when the second control signal has the low state voltage. In some embodiments, the first control signal has the low state voltage when the second control signal has the high state voltage. In some embodiments, the high state voltage is between 3 V and 5 V. In some embodiments, the high state voltage is less than 3 V. In some embodiments, the high state voltage is greater than 5 V. In some embodiments, the low state voltage is between 0 V and 2 V. In some embodiments, the low state voltage is greater than 2 V.

In some embodiments, responsive to the first control signal having the high state voltage, the first switch cell 202 is configured to maintain a connection between the drain terminal (D) of the first switch cell 202 and the source terminal (S) of the first switch cell 202. In some embodiments, responsive to the first control signal having the low state voltage, the first switch cell 202 is configured to maintain a disconnection between the drain terminal (D) of the first switch cell 202 and the source terminal (S) of the first switch cell 202. In some embodiments, responsive to the first control signal having the high state voltage, the fourth switch cell 212 is configured to maintain a connection between the drain terminal (D) of the fourth switch cell 212 and the source terminal (S) of the fourth switch cell 212. In some embodiments, responsive to the first control signal having the low state voltage, the fourth switch cell 212 is configured to maintain a disconnection between the drain terminal (D) of the fourth switch cell 212 and the source terminal (S) of the fourth switch cell 212.

In some embodiments, responsive to the second control signal having the high state voltage, the second switch cell 204 is configured to maintain a connection between the drain terminal (D) of the second switch cell 204 and the source terminal (S) of the second switch cell 204. In some embodiments, responsive to the second control signal having the low state voltage, the second switch cell 204 is configured to maintain a disconnection between the drain terminal (D) of the second switch cell 204 and the source terminal (S) of the second switch cell 204. In some embodiments, responsive to the second control signal having the high state voltage, the third switch cell 210 is configured to maintain a connection between the drain terminal (D) of the third switch cell 210 and the source terminal (S) of the third switch cell 210. In some embodiments, responsive to the second control signal having the low state voltage, the third switch cell 210 is configured to maintain a disconnection between the drain terminal (D) of the third switch cell 210 and the source terminal (S) of the third switch cell 210.

In some embodiments, during a first portion of time, the first control signal has the high state voltage. In some embodiments, during the first portion of time, the second control signal has the low state voltage. In some embodiments, during the first portion of time, the first node 206 is connected to the antenna terminal and the second node 208 is connected to the second voltage source 216. In some embodiments, during the first portion of time, the first node 206 is not connected to the first voltage source 214 and the second node 208 is not connected to the antenna terminal. In some embodiments, during a second portion of time, the first control signal has the low state voltage. In some embodiments, during the second portion of time, the second control signal has the high state voltage. In some embodiments, during the second portion of time, the second node 208 is connected to the antenna terminal and the first node 206 is connected to the first voltage source 214. In some embodiments, during the second portion of time, the second node 208 is not connected to the second voltage source 216 and the first node 206 is not connected to the antenna terminal.

In some embodiments, a first RF signal exists at the first node 206. In some embodiments, the first node 206 is connected to a first circuit. In some embodiments, the first RF signal is generated by a wirelessly connected signal generating component. In some embodiments, during the first portion of time, the first circuit is configured to receive the first RF signal from the antenna terminal via the first switch cell 202. In some embodiments, the first RF signal is generated by a portion of the first circuit. In some embodiments, during the first portion of time, the first circuit is configured to transmit the first RF signal to the antenna terminal via the first switch cell 202.

In some embodiments, a second RF signal exists at the second node 208. In some embodiments, the second node 208 is connected to a second circuit. In some embodiments, the second RF signal is generated by a wirelessly connected signal generating component. In some embodiments, during the second portion of time, the second circuit is configured to receive the second RF signal from the antenna terminal via the second switch cell 204. In some embodiments, the second RF signal is generated by a portion of the second circuit. In some embodiments, during the second portion of time, the second circuit is configured to transmit the second RF signal to the antenna terminal via the second switch cell 204.

In some embodiments, the first RF signal has a first harmonic. In some embodiments, the first harmonic of the first RF signal corresponds to a fundamental frequency. In some embodiments, the fundamental frequency of the first RF signal is a frequency at which data is represented by the first RF signal. In some embodiments, the first RF signal has a second harmonic. In some embodiments, the second harmonic of the first RF signal corresponds to a second frequency. In some embodiments, the second frequency is substantially equal to two times the fundamental frequency of the first RF signal. In some embodiments, the first RF signal has a third harmonic. In some embodiments, the third harmonic of the first RF signal corresponds to a third frequency. In some embodiments, the third frequency is substantially equal to two times the second frequency. In some embodiments, it is desired to mitigate a power of the second harmonic of the first RF signal. In some embodiments, it is desired to mitigate a power of the third harmonic of the first RF signal.

In some embodiments, the second RF signal has a first harmonic. In some embodiments, the first harmonic of the second RF signal corresponds to a fundamental frequency. In some embodiments, the fundamental frequency of the second RF signal is a frequency at which data is represented by the second RF signal. In some embodiments, the second RF signal has a second harmonic. In some embodiments, the second harmonic of the second RF signal corresponds to a fourth frequency. In some embodiments, the fourth frequency is substantially equal to two times the fundamental frequency of the second RF signal. In some embodiments, the second RF signal has a third harmonic. In some embodiments, the third harmonic of the second RF signal corresponds to a fifth frequency. In some embodiments, the fifth frequency is substantially equal to two times the fourth frequency. In some embodiments, it is desired to mitigate a power of the second harmonic of the second RF signal. In some embodiments, it is desired to mitigate a power of the third harmonic of the second RF signal.

In some embodiments, in a first instance, at least one of the first switch cell 202, the second switch cell 204, the third switch cell 210, or the fourth switch cell 212 comprises at least one of a gate-drain capacitor or a source-drain capacitor, as illustrated in FIG. 1.

In some embodiments, in a second instance, the first switch cell 202 does not comprise a gate-drain capacitor or a source-drain capacitor. In some embodiments, in the second instance, the second switch cell 204 does not comprise a gate-drain capacitor or a source-drain capacitor. In some embodiments, in the second instance, the third switch cell 210 does not comprise a gate-drain capacitor or a source-drain capacitor. In some embodiments, in the second instance, the fourth switch cell 212 does not comprise a gate-drain capacitor or a source-drain capacitor.

In some embodiments, in the first instance, during the first portion of time, the power of the second harmonic of the first RF signal is equal to a first power. In some embodiments, in the second instance, during the first portion of time, the power of the second harmonic of the first RF signal is equal to a second power. In some embodiments, the first power is less than the second power. In some embodiments, in the first instance, during the first portion of time, the power of the third harmonic of the first RF signal is equal to a third power. In some embodiments, in the second instance, during the first portion of time, the power of the third harmonic of the first RF signal is equal to a fourth power. In some embodiments, the third power is less than the fourth power.

In some embodiments, in the first instance, during the second portion of time, the power of the second harmonic of the second RF signal is equal to a fifth power. In some embodiments, in the second instance, during the second portion of time, the power of the second harmonic of the second RF signal is equal to a sixth power. In some embodiments, the fifth power is less than the sixth power. In some embodiments, in the first instance, during the second portion of time, the power of the third harmonic of the second RF signal is equal to a seventh power. In some embodiments, in the second instance, during the second portion of time, the power of the third harmonic of the second RF signal is equal to an eighth power. In some embodiments, the seventh power is less than the eighth power.

Figure 3:
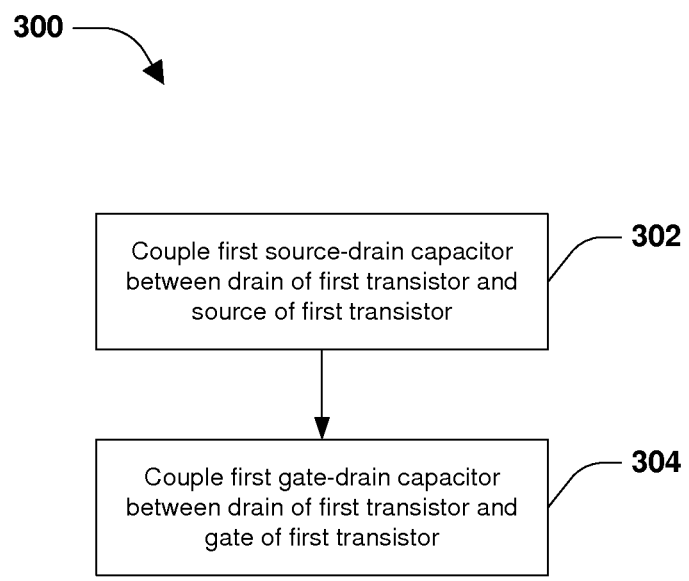
FIG. 3 illustrates a method of forming a switch cell, in accordance with some embodiments.

A method 300 of forming a switch cell is illustrated in FIG. 3, according to some embodiments. In some embodiments, at 302, a first source-drain capacitor is coupled between a drain of a first transistor of the switch cell and a source of the first transistor. In some embodiments, at 304, a first gate-drain capacitor is coupled between the drain of the first transistor and a gate of the first transistor. In some embodiments, the source of the first transistor is connected to a drain of a second transistor of the switch cell. In some embodiments, a second source-drain capacitor is coupled between the drain of the second transistor and a source of the second transistor. In some embodiments, a second gate-drain capacitor is coupled between the drain of the second transistor and a gate of the second transistor. In some embodiments, a source terminal of the switch cell is coupled to a source of a transistor within the switch cell. In some embodiments, the source terminal of the switch cell is coupled to the source of the second transistor. In some embodiments, a drain terminal of the switch cell is coupled to a drain of a transistor within the switch cell. In some embodiments, the drain terminal of the switch cell is coupled to the drain of the first transistor.

In some embodiments, a switch cell is provided. In some embodiments, the switch cell comprises a first transistor, a first source-drain capacitor and a first gate-drain capacitor. In some embodiments, the first source-drain capacitor is coupled between a drain of the first transistor and a source of the first transistor. In some embodiments, the first gate-drain capacitor is coupled between the drain of the first transistor and a gate of the first transistor.

In some embodiments, a switch cell is provided. In some embodiments, the switch cell comprises a gate terminal connected to a first side of a first resistor and to a first side of a second resistor. In some embodiments, the switch cell comprises a first transistor. In some embodiments, a gate of the first transistor is connected to a second side of the first resistor. In some embodiments, the switch cell comprises a second transistor. In some embodiments, a gate of the second transistor is connected to a second side of the second resistor. In some embodiments, the switch cell comprises a first source-drain capacitor coupled between a drain of the first transistor and a source of the first transistor. In some embodiments, the switch cell comprises a first gate-drain capacitor coupled between the drain of the first transistor and the gate of the first transistor.

In some embodiments, a method of forming a switch cell is provided. In some embodiments, the method comprises coupling a first source-drain capacitor between a drain of a first transistor and a source of the first transistor. In some embodiments, the first transistor is comprised within the switch cell. In some embodiments, the method comprises coupling a first gate-drain capacitor between the drain of the first transistor and a gate of the first transistor.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A switch cell, comprising:
   a first transistor;
   a first source-drain capacitor coupled between a drain of the first transistor and a source of the first transistor;
   a first gate-drain capacitor coupled between the drain of the first transistor and a gate of the first transistor;
   a second transistor, a source of the second transistor coupled to the drain of the first transistor;
   a second gate-drain capacitor coupled between a drain of the second transistor and a gate of the second transistor; and
   a drain terminal coupled to the drain of the second transistor.

2. The switch cell of claim 1, comprising a first resistor coupled to the gate of the first transistor.

3. The switch cell of claim 2, comprising a second resistor coupled to the gate of the second transistor, the first resistor and second resistor coupled to a common node.

4. The switch cell of claim 1, comprising a second source-drain capacitor coupled between the drain of the second transistor and the source of the second transistor.

5. The switch cell of claim 1, comprising:
   a third transistor, a drain of the third transistor coupled to the source of the first transistor; and
   a source terminal, a source of the third transistor operably coupled to the source terminal.

6. The switch cell of claim 5, comprising a fourth transistor, a drain of the fourth transistor operably coupled to the source of the third transistor, a source of the fourth transistor coupled to the source terminal.

7. The switch cell of claim 1, the first source-drain capacitor having a capacitance between about 100 fF to about 200 fF.

8. The switch cell of claim 1, the first gate-drain capacitor having a capacitance between about 300 fF to about 500 fF.

9. A switch cell, comprising:
   a gate terminal coupled to a first side of a first resistor and to a first side of a second resistor;
   a first transistor, a gate of the first transistor coupled to a second side of the first resistor;
   a second transistor, a gate of the second transistor coupled to a second side of the second resistor;
   a first source-drain capacitor coupled between a drain of the first transistor and a source of the first transistor; and
   a first gate-drain capacitor coupled between the drain of the first transistor and the gate of the first transistor.

10. The switch cell of claim 9, where the first transistor is an NMOS transistor and the second transistor is an NMOS transistor.

11. The switch cell of claim 9, comprising a drain terminal coupled to one of the drain of the first transistor or a drain of the second transistor.

12. The switch cell of claim 9, comprising a source terminal coupled to one of the source of the first transistor or a source of the second transistor.

13. The switch cell of claim 9, the first resistor and the second resistor coupled to the gate terminal at a common node.

14. The switch cell of claim 9, comprising a second gate-drain capacitor coupled between a drain of the second transistor and the gate of the second transistor.

15. The switch cell of claim 9, comprising a second source-drain capacitor coupled between a drain of the second transistor and a source of the second transistor.

16. The switch cell of claim 9, comprising:
a second gate-drain capacitor coupled between a drain of the second transistor and the gate of the second transistor; and
a second source-drain capacitor coupled between the drain of the second transistor and a source of the second transistor.

17. The switch cell of claim 16, the source of the second transistor coupled to the drain of the first transistor.

18. A method of forming a switch cell, comprising:
coupling a first source-drain capacitor between a drain of a first transistor and a source of the first transistor, the first transistor comprised within the switch cell;
coupling a first gate-drain capacitor between the drain of the first transistor and a gate of the first transistor;
coupling a second source-drain capacitor between a drain of a second transistor and a source of the second transistor, the second transistor comprised within the switch cell; and
coupling a second gate-drain capacitor between the drain of the second transistor and a gate of the second transistor.

19. The method of claim 18, comprising coupling a source terminal of the switch cell to a source.

20. The method of claim 18, comprising coupling a drain terminal of the switch cell to a drain.

\* \* \* \* \*